(12) United States Patent
Gossman et al.

(10) Patent No.: US 7,943,415 B1
(45) Date of Patent: May 17, 2011

(54) METHODS OF SPUTTERING CADMIUM SULFIDE LAYERS FOR USE IN CADMIUM TELLURIDE BASED THIN FILM PHOTOVOLTAIC DEVICES

(75) Inventors: Robert Dwayne Gossman, Aurora, CO (US); Scott Daniel Feldman-Peabody, Golden, CO (US)

(73) Assignee: Primestar Solar Inc., Arvada, CO (US)

( * ) Notice: Subject to any disclaimer, the term of this patent is extended or adjusted under 35 U.S.C. 154(b) by 0 days.

(21) Appl. No.: 12/913,390

(22) Filed: Oct. 27, 2010

(51) Int. Cl.
*H01L 21/00* (2006.01)

(52) U.S. Cl. .......................................... 438/93; 438/95

(58) Field of Classification Search ............... 438/93, 438/95; 257/E31.007
See application file for complete search history.

(56) References Cited

U.S. PATENT DOCUMENTS

| | | | |
|---|---|---|---|
| 4,465,575 A * | 8/1984 | Love et al. | 204/192.26 |
| 4,950,615 A | 8/1990 | Basol et al. | |
| 5,261,968 A | 11/1993 | Jordan | |
| 5,372,646 A | 12/1994 | Foote et al. | |
| 5,474,939 A | 12/1995 | Pollock et al. | |
| 5,922,142 A | 7/1999 | Wu et al. | |
| 6,137,048 A | 10/2000 | Wu et al. | |
| 6,169,246 B1 | 1/2001 | Wu et al. | |
| 6,423,565 B1 | 7/2002 | Barth et al. | |
| 6,444,043 B1 | 9/2002 | Gegenwart et al. | |
| 6,548,751 B2 | 4/2003 | Sverdrup, Jr. et al. | |
| 7,522,282 B2 | 4/2009 | Nolte et al. | |
| 7,659,968 B2 | 2/2010 | Wang et al. | |
| 7,663,092 B2 | 2/2010 | Nolte et al. | |
| 2005/0009228 A1 * | 1/2005 | Wu et al. | 438/95 |
| 2009/0090413 A1 * | 4/2009 | Katsoulis et al. | 136/260 |
| 2009/0194165 A1 | 8/2009 | Murphy et al. | |
| 2009/0242029 A1 | 10/2009 | Paulson et al. | |

FOREIGN PATENT DOCUMENTS

| EP | 2034002 | 3/2009 |
|---|---|---|
| EP | 2110904 | 10/2009 |

OTHER PUBLICATIONS

"Magnetron Reactive Sputtering Deposition of $Cu_2S$-CdS Solar Cells", Anderson W. W, et al., Community of the European Communities, $2^{nd}$ E.C. Photovoltaic Solar Energy Conference, 1979, pp. 890-897, ISBN: 90-277-1021-X.*

* cited by examiner

*Primary Examiner* — William M. Brewster
(74) *Attorney, Agent, or Firm* — Dority & Manning, P.A.

(57) ABSTRACT

Methods are generally provided of sputtering a cadmium sulfide layer on a substrate. The cadmium sulfide layer can be sputtered on a substrate from a target in a sputtering atmosphere, wherein the target comprises about 75% to about 100% by weight cadmium, and wherein the sputtering atmosphere comprises a sulfur-containing source gas. The cadmium sulfide layer can be used in methods of forming cadmium telluride thin film photovoltaic devices.

15 Claims, 3 Drawing Sheets

METHODS OF SPUTTERING CADMIUM SULFIDE LAYERS FOR USE IN CADMIUM TELLURIDE BASED THIN FILM PHOTOVOLTAIC DEVICES

FIELD OF THE INVENTION

The subject matter disclosed herein relates generally to cadmium sulfide thin film layers and their methods of deposition. More particularly, the subject matter disclosed herein relates to cadmium sulfide layers for use in cadmium telluride thin film photovoltaic devices and their methods of manufacture.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials. The junction of the n-type layer and the p-type layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type layer (i.e., a positive, electron accepting layer) and the CdS layer acts as a n-type layer (i.e., a negative, electron donating layer).

The cadmium sulfide layer is a "window layer" in the photovoltaic device since light energy passes through it into the cadmium telluride layer. However, sputtering a cadmium sulfide layer from a cadmium sulfide target is an expensive process, and generally uses the source material inefficiently.

A need exists for a method of sputtering a cadmium sulfide layer in a more cost effective manner and producing a substantially uniform cadmium sulfide layer, particularly in a commercial-scale manufacturing process of cadmium telluride thin film photovoltaic devices.

BRIEF DESCRIPTION OF THE INVENTION

Aspects and advantages of the invention will be set forth in part in the following description, or may be obvious from the description, or may be learned through practice of the invention.

Methods are generally provided of sputtering a cadmium sulfide layer on a substrate. The cadmium sulfide layer can be sputtered on a substrate from a target in a sputtering atmosphere, wherein the target comprises about 75% to about 100% by weight cadmium, and wherein the sputtering atmosphere comprises a sulfur-containing source gas. The cadmium sulfide layer can be used in methods of forming cadmium telluride thin film photovoltaic devices.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Figure 1:
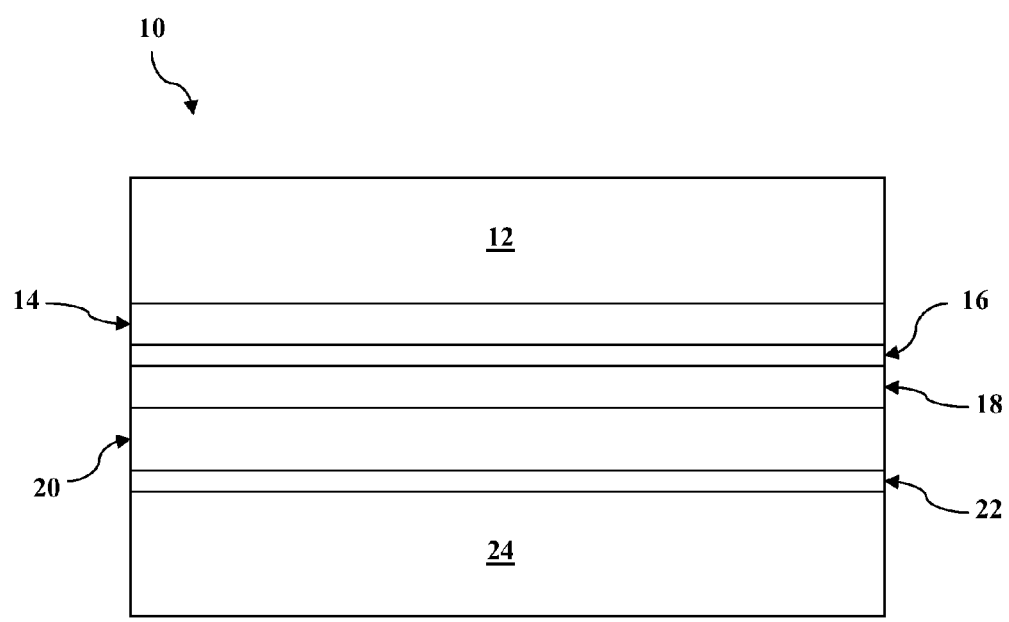
FIG. 1 shows a general schematic of a cross-sectional view of an exemplary cadmium telluride thin film photovoltaic device according to one embodiment of the present invention.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "µm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Generally speaking, methods are disclosed for sputtering cadmium sulfide layers onto a substrate from a metal target containing cadmium in a sputtering atmosphere containing sulfur, particularly those cadmium sulfide layers included in a cadmium telluride based thin film photovoltaic device.

These sputtering methods can produce a substantially uniform cadmium sulfide layer on the substrate in a cost efficient manner.

The metal target used to sputter the thin film layer generally includes cadmium, such as having a cadmium content of about 75 molar % to 100 molar %, such as about 90 molar % to 100 molar %. In one embodiment, the metal target can consist essentially of cadmium (i.e., being substantially free from other metals). As used herein, the term "substantially free" means no more than an insignificant trace amount present and encompasses completely free (e.g., 0 molar % up to 0.0001 molar %). In one embodiment, the target can be substantially free from sulfur.

The sputtering atmosphere generally includes a sulfur-containing source gas to provide sulfur to the cadmium sulfide layer formed on the substrate. The sulfur gas source can be any suitable gas that contains a sulfur atom, such as sulfur gas ($S_2$), hydrogen sulfide ($H_2S$), carbon disulfide ($CS_2$), sulfur hexafluoride ($SF_6$), sulfur dichloride ($SCl_2$), dimethyl sulfide ($S(CH_3)_2$), alkane thiols, thioethers, or mixtures thereof. However, in certain embodiments, the sputtering atmosphere can be substantially free from fluorine and/or chlorine, such as substantially free from halides. These halides can raise undesirable manufacturing issues by corroding the manufacturing equipment, and providing undesired inclusion into the deposited layer. In addition or in the alternative, the sputtering atmosphere can be substantially free from carbon, which can provide complications to the deposited cadmium sulfide layer.

The sputtering atmosphere can include the sulfur-containing source gas in an amount of about 25% to 100% by volume, such as about 50% to 100% by volume. An inert gas (e.g., argon) can also be included in the sputtering atmosphere.

The sputtering atmosphere can also include a gathering agent to consume any byproduct materials generated from the decomposition of the sulfur-containing source gas. The gathering agent may be oxygen gas ($O_2$), hydrogen ($H_2$), or other suitable agents, or mixtures thereof. For example, the gathering agent can be included in the sputtering atmosphere up to about 25% by volume, such as about 1% to about 20% by volume. Also, the inclusion of oxygen in the sputtering atmosphere can add oxygen into the cadmium sulfide layer, which can cause the optical bandgap to shift to include higher energy radiation (such as blue and ultraviolet radiation). Thus, a cadmium sulfide layer including oxygen can allow more light to enter the cadmium telluride layer for conversion to electrical current, resulting in a more efficient photovoltaic device. For example, the sputtering atmosphere can include the sulfur-containing source gas in an amount of about 25% to about 95% by volume (e.g., about 50% to about 85%) and the gathering agent (e.g., oxygen gas) in a gathering amount of about 1% to about 25% by volume (e.g., about 5% to about 15%).

Sputtering deposition generally involves ejecting material from a target, which is the material source, and depositing the ejected material onto the substrate to form the film. DC sputtering generally involves applying a direct current to a metal target (i.e., the cathode) positioned near the substrate (i.e., the anode) within a sputtering chamber to form a direct-current discharge. The sputtering chamber can have a reactive atmosphere (e.g., including sulfur in addition to oxygen, nitrogen, etc.) that forms a plasma field between the metal target and the substrate. Other inert gases (e.g., argon, etc.) may also be present. The pressure of the reactive atmosphere can be between about 1 mTorr and about 20 mTorr for magnetron sputtering. The pressure can be even higher for diode sputtering (e.g., from about 25 mTorr to about 100 mTorr). When metal atoms are released from the target upon application of the voltage, the metal atoms deposit onto the surface of the substrate. For example, when the atmosphere contains oxygen, the metal atoms released from the metal target can form a metallic oxide layer on the substrate. The current applied to the source material can vary depending on the size of the source material, size of the sputtering chamber, amount of surface area of substrate, and other variables. In some embodiments, the current applied can be from about 2 amps to about 20 amps. Conversely, RF sputtering involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) which may or may not contain reactive species (e.g., oxygen, nitrogen, etc.) having a pressure between about 1 mTorr and about 20 mTorr for magnetron sputtering. Again, the pressure can be even higher for diode sputtering (e.g., from about 25 mTorr to about 100 mTorr).

Figure 2:
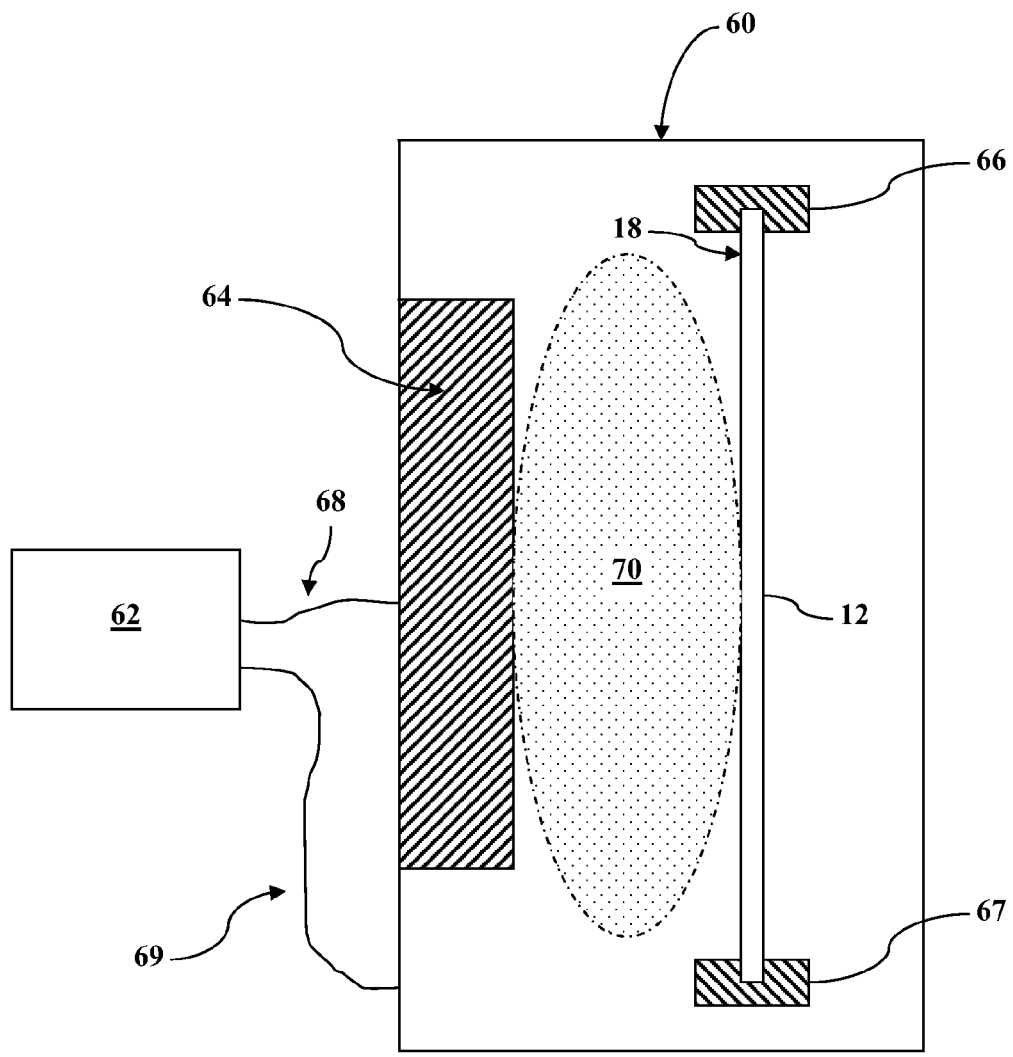
FIG. 2 shows a general schematic of a cross-sectional view of an exemplary DC sputtering chamber according to one embodiment of the present invention; and, FIG. 3 shows a flow diagram of an exemplary method of manufacturing a photovoltaic module including a cadmium telluride thin film photovoltaic device.

FIG. 2 shows a general schematic as a cross-sectional view of an exemplary DC sputtering chamber 60 according to one embodiment of the present invention. A DC power source 62 is configured to control and supply DC power to the chamber 60. As shown, the DC power source applies a voltage to the cathode 64 to create a voltage potential between the cathode 64 and an anode formed by the chamber wall, such that the substrate is in between the cathode and anode. The glass substrate 12 is held between top support 66 and bottom support 67 via wires 68 and 69, respectively. Generally, the glass substrate 12 is positioned within the sputtering chamber 60 such that the cadmium sulfide layer 18 is formed on the surface facing the cathode 64, and generally on the TCO layer 14 and RTB layer 16 (not shown) as discussed below.

A plasma field 70 is created once the sputtering atmosphere is ignited, and is sustained in response to the voltage potential between the cathode 64 and the chamber wall acting as an anode. The voltage potential causes the plasma ions within the plasma field 70 to accelerate toward the cathode 64, causing atoms from the cathode 64 to be ejected toward the surface on the glass substrate 12. As such, the cathode 64 can be referred to as a "target" and acts as the source material for the formation of the cadmium sulfide layer 18 on the surface of the glass substrate 12 facing the cathode 64. To form the cadmium sulfide layer, the cathode 64 can be a metal alloy target, such as of cadmium as discussed above. Since the sputtering atmosphere contains a sulfur-containing source gas, sulfur particles of the plasma field 70 can react with the ejected target atoms (i.e., cadmium atoms) to form a cadmium sulfide layer 18 on the substrate 12.

Although only a single DC power source 62 is shown, the voltage potential can be realized through the use of multiple power sources coupled together. Additionally, the exemplary sputtering chamber 60 is shown having a vertical orientation, although any other configuration can be utilized. After exiting the sputtering chamber 60, the substrate 12 can enter an adjacent annealing oven (not shown) to begin the annealing process.

The presently provided methods of sputtering a cadmium sulfide layer can be utilized in the formation of any film stack that utilizes a cadmium sulfide layer. For example, the cadmium sulfide layer can be used during the formation of any cadmium telluride device that utilizes a cadmium telluride layer, such as in the cadmium telluride thin film photovoltaic device disclosed in U.S. Publication No. 2009/0194165 of Murphy, et al. titled "Ultra-high Current Density Cadmium Telluride Photovoltaic Modules."

FIG. 1 represents an exemplary cadmium telluride thin film photovoltaic device 10 that can be formed according to methods described herein. The exemplary device 10 of FIG. 1 includes a top sheet of glass 12 employed as the substrate. In this embodiment, the glass 12 can be referred to as a "superstrate," as it is the substrate on which the subsequent layers are formed even though it faces upward to the radiation source (e.g., the sun) when the cadmium telluride thin film photovoltaic device 10 is in used. The top sheet of glass 12 can be a high-transmission glass (e.g., high transmission borosilicate glass), low-iron float glass, or other highly transparent material. The glass is generally thick enough to provide support for the subsequent film layers (e.g., from about 0.5 mm to about 10 mm thick), and is substantially flat to provide a good surface for forming the subsequent film layers. In one embodiment, the glass 12 can be a low iron float glass containing less than about 0.015% by weight iron (Fe), and may have a transmissiveness of about 0.9 or greater in the spectrum of interest (e.g., wavelengths from about 300 nm to about 900 nm). In another embodiment, borosilicate glass may be utilized so as to better withstand high temperature processing.

The transparent conductive oxide (TCO) layer 14 is shown on the glass 12 of the exemplary device 10 of FIG. 1. The TCO layer 14 allows light to pass through with minimal absorption while also allowing electric current produced by the device 10 to travel sideways to opaque metal conductors (not shown). For instance, the TCO layer 14 can have a sheet resistance less than about 30 ohm per square, such as from about 4 ohm per square to about 20 ohm per square (e.g., from about 8 ohm per square to about 15 ohm per square). In certain embodiments, the TCO layer 14 can have a thickness between about 0.1 μm and about 1 μm, for example from about 0.1 μm to about 0.5 μm, such as from about 0.25 μm to about 0.35 μm.

A resistive transparent buffer layer 16 (RTB layer) is shown on the TCO layer 14 on the exemplary cadmium telluride thin film photovoltaic device 10. The RTB layer 16 is generally more resistive than the TCO layer 14 and can help protect the device 10 from chemical interactions between the TCO layer 14 and the subsequent layers during processing of the device 10. For example, in certain embodiments, the RTB layer 16 can have a sheet resistance that is greater than about 1000 ohms per square, such as from about 10 kOhms per square to about 1000 MOhms per square. The RTB layer 16 can also have a wide optical bandgap (e.g., greater than about 2.5 eV, such as from about 2.7 eV to about 3.0 eV).

Without wishing to be bound by a particular theory, it is believed that the presence of the RTB layer 16 between the TCO layer 14 and the cadmium sulfide layer 18 can allow for a relatively thin cadmium sulfide layer 18 to be included in the device 10 by reducing the possibility of interface defects (i.e., "pinholes" in the cadmium sulfide layer 18) creating shunts between the TCO layer 14 and the cadmium telluride layer 20. Thus, it is believed that the RTB layer 16 allows for improved adhesion and/or interaction between the TCO layer 14 and the cadmium telluride layer 20, thereby allowing a relatively thin cadmium sulfide layer 18 to be formed thereon without significant adverse effects that would otherwise result from such a relatively thin cadmium sulfide layer 18 formed directly on the TCO layer 14.

The RTB layer 16 can include, for instance, a combination of zinc oxide (ZnO) and tin oxide ($SnO_2$), which can be referred to as a zinc tin oxide layer ("ZTO"). In one particular embodiment, the RTB layer 16 can include more tin oxide than zinc oxide. For example, the RTB layer 16 can have a composition with a stoichiometric ratio of $ZnO/SnO_2$ between about 0.25 and about 3, such as in about an one to two (1:2) stoichiometric ratio of tin oxide to zinc oxide. The RTB layer 16 can be formed by sputtering, chemical vapor deposition, spraying pryolysis, or any other suitable deposition method. In one particular embodiment, the RTB layer 16 can be formed by sputtering (e.g. DC sputtering or RF sputtering) on the TCO layer 14 (as discussed below in greater detail with respect to the deposition of the cadmium sulfide layer 18). For example, the RTB layer 16 can be deposited using a DC sputtering method by applying a DC current to a metallic source material (e.g., elemental zinc, elemental tin, or a mixture thereof) and sputtering the metallic source material onto the TCO layer 14 in the presence of an oxidizing atmosphere (e.g., $O_2$ gas). When the oxidizing atmosphere includes oxygen gas (i.e., $O_2$), the atmosphere can be greater than about 95% pure oxygen, such as greater than about 99%.

In certain embodiments, the RTB layer 16 can have a thickness between about 0.075 μm and about 1 μm, for example from about 0.1 μm to about 0.5 μm. In particular embodiments, the RTB layer 16 can have a thickness between about 0.08 μm and about 0.2 μm, for example from about 0.1 μm to about 0.15 μm.

A cadmium sulfide layer 18 is shown on RTB layer 16 of the exemplary device 10 of FIG. 1. The cadmium sulfide layer 18 is a n-type layer that generally includes cadmium sulfide (CdS), but may also include other materials, such as zinc sulfide, cadmium zinc sulfide, etc., and mixtures thereof as well as dopants and other impurities. The cadmium sulfide layer 18 can have a wide band gap (e.g., from about 2.25 eV to about 2.5 eV, such as about 2.4 eV) in order to allow most radiation energy (e.g., solar radiation) to pass. As such, the cadmium sulfide layer 18 is considered a transparent layer on the device 10.

In one particular embodiment, the cadmium sulfide layer 18 can be formed by sputtering (e.g., direct current (DC) sputtering or radio frequency (RF) sputtering) on the resistive transparent buffer layer 16 as discussed above.

Due to the presence of the resistive transparent buffer layer 16, the cadmium sulfide layer 18 can have a thickness that is less than about 0.1 μm, such as between about 10 nm and about 100 nm, such as from about 50 nm to about 80 nm, with a minimal presence of pinholes between the resistive transparent buffer layer 16 and the cadmium sulfide layer 18. Additionally, a cadmium sulfide layer 18 having a thickness less than about 0.1 μm reduces any absorption of radiation energy by the cadmium sulfide layer 18, effectively increasing the amount of radiation energy reaching the underlying cadmium telluride layer 20.

A cadmium telluride layer 20 is shown on the cadmium sulfide layer 18 in the exemplary cadmium telluride thin film photovoltaic device 10 of FIG. 1. The cadmium telluride layer 20 is a p-type layer that generally includes cadmium telluride (CdTe) but may also include other materials. As the p-type layer of device 10, the cadmium telluride layer 20 is the photovoltaic layer that interacts with the cadmium sulfide layer 18 (i.e., the n-type layer) to produce current from the absorption of radiation energy by absorbing the majority of the radiation energy passing into the device 10 due to its high absorption coefficient and creating electron-hole pairs. For example, the cadmium telluride layer 20 can generally be formed from cadmium telluride and can have a bandgap tailored to absorb radiation energy (e.g., from about 1.4 eV to about 1.5 eV, such as about 1.45 eV) to create the maximum number of electron-hole pairs with the highest electrical potential (voltage) upon absorption of the radiation energy. Electrons may travel from the p-type side (i.e., the cadmium telluride layer 20) across the junction to the n-type side (i.e., the cadmium sulfide layer 18) and, conversely, holes may pass from the n-type side to the p-type side. Thus, the p-n junction formed between the cadmium sulfide layer 18 and the cadmium telluride layer 20 forms a diode in which the charge imbalance leads to the creation of an electric field spanning the p-n junction. Conventional current is allowed to flow in only one direction and separates the light induced electron-hole pairs.

The cadmium telluride layer 20 can be formed by any known process, such as vapor transport deposition, chemical vapor deposition (CVD), spray pyrolysis, electro-deposition, sputtering, close-space sublimation (CSS), etc. In one particular embodiment, the cadmium sulfide layer 18 is deposited by a sputtering and the cadmium telluride layer 20 is deposited by close-space sublimation. In particular embodiments, the cadmium telluride layer 20 can have a thickness between about 0.1 µm and about 10 µm, such as from about 1 µm and about 5 µm. In one particular embodiment, the cadmium telluride layer 20 can have a thickness between about 2 µm and about 4 µm, such as about 3 µm.

A series of post-forming treatments can be applied to the exposed surface of the cadmium telluride layer 20. These treatments can tailor the functionality of the cadmium telluride layer 20 and prepare its surface for subsequent adhesion to the back contact layer(s) 22. For example, the cadmium telluride layer 20 can be annealed at elevated temperatures (e.g., from about 350° C. to about 500° C., such as from about 375° C. to about 424° C.) for a sufficient time (e.g., from about 1 to about 10 minutes) to create a quality p-type layer of cadmium telluride. Without wishing to be bound by theory, it is believed that annealing the cadmium telluride layer 20 (and the device 10) converts the normally lightly p-type doped, or even n-type doped cadmium telluride layer 20 to a more strongly p-type cadmium telluride layer 20 having a relatively low resistivity. Additionally, the cadmium telluride layer 20 can recrystallize and undergo grain growth during annealing.

Annealing the cadmium telluride layer 20 can be carried out in the presence of cadmium chloride in order to dope the cadmium telluride layer 20 with chloride ions. For example, the cadmium telluride layer 20 can be washed with an aqueous solution containing cadmium chloride and then annealed at the elevated temperature.

In one particular embodiment, after annealing the cadmium telluride layer 20 in the presence of cadmium chloride, the surface can be washed to remove any cadmium oxide formed on the surface. This surface preparation can leave a Te-rich surface on the cadmium telluride layer 20 by removing oxides from the surface, such as CdO, $CdTeO_3$, $CdTe_2O_5$, etc. For instance, the surface can be washed with a suitable solvent (e.g., ethylenediamine also known as 1,2 diaminoethane or "DAE") to remove any cadmium oxide from the surface.

Additionally, copper can be added to the cadmium telluride layer 20. Along with a suitable etch, the addition of copper to the cadmium telluride layer 20 can form a surface of copper-telluride on the cadmium telluride layer 20 in order to obtain a low-resistance electrical contact between the cadmium telluride layer 20 (i.e., the p-type layer) and the back contact layer(s). Specifically, the addition of copper can create a surface layer of cuprous telluride ($Cu_2Te$) between the cadmium telluride layer 20 and the back contact layer 22. Thus, the Te-rich surface of the cadmium telluride layer 20 can enhance the collection of current created by the device through lower resistivity between the cadmium telluride layer 20 and the back contact layer 22.

Copper can be applied to the exposed surface of the cadmium telluride layer 20 by any process. For example, copper can be sprayed or washed on the surface of the cadmium telluride layer 20 in a solution with a suitable solvent (e.g., methanol, water, or the like, or combinations thereof) followed by annealing. In particular embodiments, the copper may be supplied in the solution in the form of copper chloride, copper iodide, or copper acetate. The annealing temperature is sufficient to allow diffusion of the copper ions into the cadmium telluride layer 20, such as from about 125° C. to about 300° C. (e.g. from about 150° C. to about 200° C.) for about 5 minutes to about 30 minutes, such as from about 10 to about 25 minutes.

A back contact layer 22 is shown on the cadmium telluride layer 20. The back contact layer 22 generally serves as the back electrical contact, in relation to the opposite, TCO layer 14 serving as the front electrical contact. The back contact layer 22 can be formed on, and in one embodiment is in direct contact with, the cadmium telluride layer 20. The back contact layer 22 is suitably made from one or more highly conductive materials, such as elemental nickel, chromium, copper, tin, aluminum, gold, silver, technetium or alloys or mixtures thereof. Additionally, the back contact layer 22 can be a single layer or can be a plurality of layers. In one particular embodiment, the back contact layer 22 can include graphite, such as a layer of carbon deposited on the p-layer followed by one or more layers of metal, such as the metals described above. The back contact layer 22, if made of or comprising one or more metals, is suitably applied by a technique such as sputtering or metal evaporation. If it is made from a graphite and polymer blend, or from a carbon paste, the blend or paste is applied to the semiconductor device by any suitable method for spreading the blend or paste, such as screen printing, spraying or by a "doctor" blade. After the application of the graphite blend or carbon paste, the device can be heated to convert the blend or paste into the conductive back contact layer. A carbon layer, if used, can be from about 0.1 µm to about 10 µm in thickness, for example from about 1 µm to about 5 µm. A metal layer of the back contact, if used for or as part of the back contact layer 22, can be from about 0.1 µm to about 1.5 µm in thickness.

The encapsulating glass 24 is also shown in the exemplary cadmium telluride thin film photovoltaic device 10 of FIG. 1.

Other components (not shown) can be included in the exemplary device 10, such as bus bars, external wiring, laser etches, etc. For example, when the device 10 forms a photovoltaic cell of a photovoltaic module, a plurality of photovoltaic cells can be connected in series in order to achieve a desired voltage, such as through an electrical wiring connection. Each end of the series connected cells can be attached to a suitable conductor such as a wire or bus bar, to direct the photovoltaically generated current to convenient locations for connection to a device or other system using the generated electric. A convenient means for achieving such series connections is to laser scribe the device to divide the device into a series of cells connected by interconnects. In one particular embodiment, for instance, a laser can be used to scribe the deposited layers of the semiconductor device to divide the device into a plurality of series connected cells.

Figure 3:
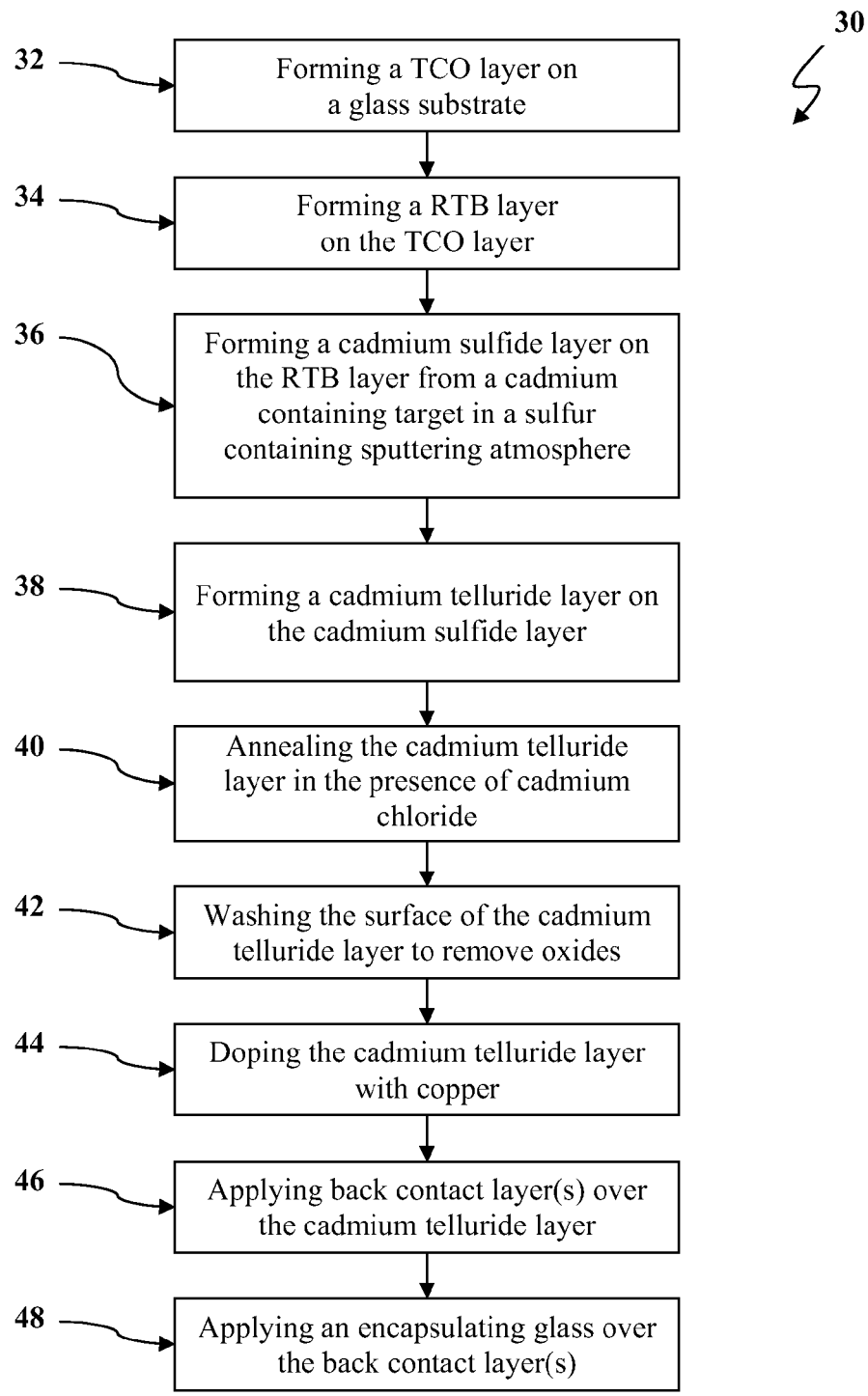

FIG. 3 shows a flow diagram of an exemplary method 30 of manufacturing a photovoltaic device according to one embodiment of the present invention. According to the exemplary method 30, a TCO layer is formed on a glass substrate at 32. At 34, a resistive transparent buffer layer is formed on the TCO layer. A cadmium sulfide layer is sputtered on the resistive transparent buffer layer from a metal target containing cadmium in a sputtering atmosphere containing a sulfur-containing source gas at 36. A cadmium telluride layer is formed on the cadmium sulfide layer at 38. The cadmium telluride layer can be annealed in the presence of cadmium chloride at 40, and washed to remove oxides formed on the surface at 42. The cadmium telluride layer can be doped with copper at 44. At 46, back contact layer(s) can be applied over the cadmium telluride layer, and an encapsulating glass can be applied over the back contact layer at 48.

One of ordinary skill in the art should recognize that other processing and/or treatments can be included in the method 30. For instance, the method may also include laser scribing to form electrically isolated photovoltaic cells in the device. These electrically isolated photovoltaic cells can then be connected in series to form a photovoltaic module. Also, electrical wires can be connected to positive and negative terminals of the photovoltaic module to provide lead wires to harness electrical current produced by the photovoltaic module.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of manufacturing a cadmium telluride thin film photovoltaic device, the method comprising:
    depositing a resistive transparent buffer layer on a transparent conductive oxide layer, wherein the transparent conductive oxide layer is on a substrate;
    sputtering a cadmium sulfide layer to a thickness of about 10 nm to about 100 nm on the resistive transparent buffer layer from a target in a sputtering atmosphere, wherein the target comprises about 75% to about 100% by weight cadmium, and wherein the sputtering atmosphere comprises a sulfur-containing source gas and oxygen; and,
    depositing a cadmium telluride layer on the cadmium sulfide layer.

2. The method as in claim 1, wherein the target is substantially free from sulfur.

3. The method as in claim 1, wherein the target consists essentially of cadmium.

4. The method as in claim 1, wherein the sputtering atmosphere comprises the sulfur-containing source gas in an amount of about 25% to 95% by volume.

5. The method as in claim 1, wherein the sulfur-containing source gas includes sulfur gas, hydrogen sulfide, carbon disulfide, sulfur hexafluoride, sulfur dichloride, alkane thiols, thioethers, or mixtures thereof.

6. The method as in claim 1, wherein the sulfur-containing source gas is hydrogen sulfide.

7. The method as in claim 1, wherein the cadmium sulfide layer is sputtered to the thickness of about 50 nm to about 80 nm.

8. The method as in claim 1, wherein the sputtering atmosphere comprises oxygen gas in an oxygen amount of about 1% to about 25% by volume.

9. The method as in claim 1, wherein the sputtering atmosphere comprises oxygen gas in an oxygen amount of about 5% to about 15% by volume.

10. The method as in claim 1, wherein the sputtering atmosphere comprises the sulfur-containing source gas in an amount of about 50% to about 85% by volume.

11. The method as in claim 1, wherein the target consists of cadmium.

12. The method as in claim 1, wherein the sulfur-containing source gas is sulfur dichloride.

13. The method as in claim 1, wherein the sputtering atmosphere is substantially free from halides.

14. The method as in claim 1, wherein the sputtering atmosphere is substantially free from carbon.

15. The method as in claim 1, wherein the sputtering atmosphere has a sputtering pressure of about 10 mTorr to about 150 mTorr.

\* \* \* \* \*